US005579924A

United States Patent [19]
Sands et al.

[11] Patent Number: 5,579,924
[45] Date of Patent: Dec. 3, 1996

[54] ACCESSORY STORAGE SYSTEM AND APPARATUS

[75] Inventors: Steve Sands; Steve Mills, both of Austin, Tex.

[73] Assignee: Dell USA, L.P., Austin, Tex.

[21] Appl. No.: 355,360

[22] Filed: Dec. 13, 1994

[51] Int. Cl.$^6$ ............................................ A47F 7/00
[52] U.S. Cl. ............................................ 211/26
[58] Field of Search ................... 211/26, 88, 71; 248/213.2, 220.21, 220.22, 222.52

[56] References Cited

U.S. PATENT DOCUMENTS 4,008,808  2/1977  Ramsay ..................... 211/88 X
4,457,436  7/1984  Kelley ........................ 211/88
5,375,802  12/1994  Branham, II ............... 211/94 X Primary Examiner—Alvin C. Chin-Shue
Assistant Examiner—Sarah L. Purol
Attorney, Agent, or Firm—Haynes & Boone, L.L.P.

[57] ABSTRACT

A mounting accessory and storage system includes an accessory bracket which is designed to be detachably connected to an associated electronic equipment box in a closed or storage position without extending beyond the perimeter of the box during shipment of the electronic equipment. The mounting accessory is easily detachable from the box and reinstalled in a second position in the box which provides an extended bracket interface, connected to but extending beyond the perimeter of the box, to overlap with a corresponding mounting edge of an equipment mounting rack unit.

12 Claims, 4 Drawing Sheets

ACCESSORY STORAGE SYSTEM AND APPARATUS

FIELD OF THE INVENTION

The present invention relates generally to mechanical mounting systems for electronic or other equipment and more particularly to an improved mounting system and interfacing accessory for use in mounting electronic equipment in racks or similar shelving systems.

BACKGROUND OF THE INVENTION

As the use of personal computers has proliferated, as well as the power and capacity of such computers, more and larger application requirements are being met through the implementation of PC systems. Many such large applications are now being serviced through the use of a network application in which a large number of terminals or PCs are connected together, and each has access to many programs and data through a common server. In many such systems, especially where the computer system serves an entire operation or a large business, there are many servers operating at the same time to serve different groups within the business.

In general, the servers are not only relatively expensive, but they are also critical to the operation of the business. For that reason, servers are usually grouped together in one area or room which can be better controlled environmentally and also to limit access to the equipment and insure system integrity. With the servers in a designated server area, they can be better serviced and maintained. Moreover, as the applications become larger and larger, the servers can access related peripheral equipment, such as CD ROMs and hard drives, to provide very large databases and other capabilities to the terminals. That peripheral equipment can also be mounted in the central server location thereby allowing more space at the terminals for the terminal user's needs.

In general, where electronic equipment is placed in a central location, the units are mounted in a rack or enclosed cabinet in order to conserve space. Such racks may have several CPUs or disk drive storage units for example, mounted one above another on vertically displaced shelves. With electronic equipment and computers and servers, since there is a need to access the individual boxes containing the electronics in order to service the unit or install additional or new hardware or software, most of the time the electronic "boxes" are mounted directly to side "arms" that are operable to extend outwardly from the casing or rack to provide access to a technician.

In many such rack systems, there is provided a vertical "lip" or edge on each side of the rack for alignment and, in some cases, to help in securing the electronic boxes to the racks. The vertical lip runs vertically along the entire length of the rack or cabinet and the servers are usually secured to the lip by means of screws or nuts and bolts. The lip then also serves to provide a dust-guard to limit or exclude dust from settling on the circuit boards and chips located within the servers. However, while the usefulness of the attaching lip or plate is desirable, it often precludes a mounting arrangement whereby the server or other electronic unit may be moved outwardly from the rack for service or system modification. Usually, all of the mounting screws need to be removed before the units can be pulled out of the rack for service. Other problems occur when the mounting screws are actually connected through holes in the side panels of the electronic equipment units. As the units, over time, are detached from the rack housings and taken out of the rack and then replaced, the mounting holes in the electronic equipment boxes become oversized and distorted thus loosening the mount and making the electronic equipment susceptible to breakage and dust.

Another problem occurs when equipment manufacturers ship modified versions of their equipment for rack mounting. Many companies attach mounting devices to the electronic boxes to enable the user to be able to directly mount the device in a rack upon arrival at the user's facility. In many cases, this entails the addition of a bracket or other device either shipped separately or actually attached to the electronic device. When such brackets are attached, they are easily broken or damaged during shipment (since the brackets usually extend outside of the normal contour of the electronic device to be mounted), and when shipped separately the brackets are very often lost. Moreover, even when the bracketed device arrives without significant damage, extra care must be taken not to damage the unit during mounting and, extra mounting hardware must still be used in securing or lining up the unit with the rack housing.

OBJECTS OF THE INVENTION

Accordingly, it is an object of the present invention to provide an improved mounting apparatus which can be used with currently available electronic gear racks and which requires no special mounting hardware.

It is another object of the present invention to provide an improved mounting system for electronic equipment which enables associated mounting devices to be detachably stored with the electronic equipment.

It is still another object of the present invention to provide an improved mounting system as set forth which further includes bracket devices which may be stored in a storage position as detachable elements of the electronic equipment during shipment or long term storage.

It yet another object of the present invention to provide an improved mounting system and bracket arrangement as set forth, in which the detachable elements may be easily detached from the electronic equipment, and readily installed, without special tools or additional hardware, to a second operational position in an electronic gear rack in conjunction with the electronic equipment which is being mounted.

SUMMARY OF THE INVENTION

These and other objects and features of the present invention, are accomplished in accordance with the present invention wherein an accessory apparatus is designed to be used with corresponding structure built into a related electronic or other container or box which, in turn, may be mounted on an equipment rack. The accessory is, in one arrangement, stored in an unobtrusive position with the box during shipment of the box, and deployed in another operational position to provide an extension of the box thereby enabling an aligned and full fit within the width of the equipment rack. The container with which the accessory is used includes storage and deployment brackets to accommodate the accessory in either of the two positions.

BRIEF DESCRIPTION OF THE DRAWINGS

A better understanding of the present invention can be obtained when the following detailed description and claims are had and considered in conjunction with the accompanying dryings, in which:

DETAILED DESCRIPTION OF THE INVENTION

Figure 1:
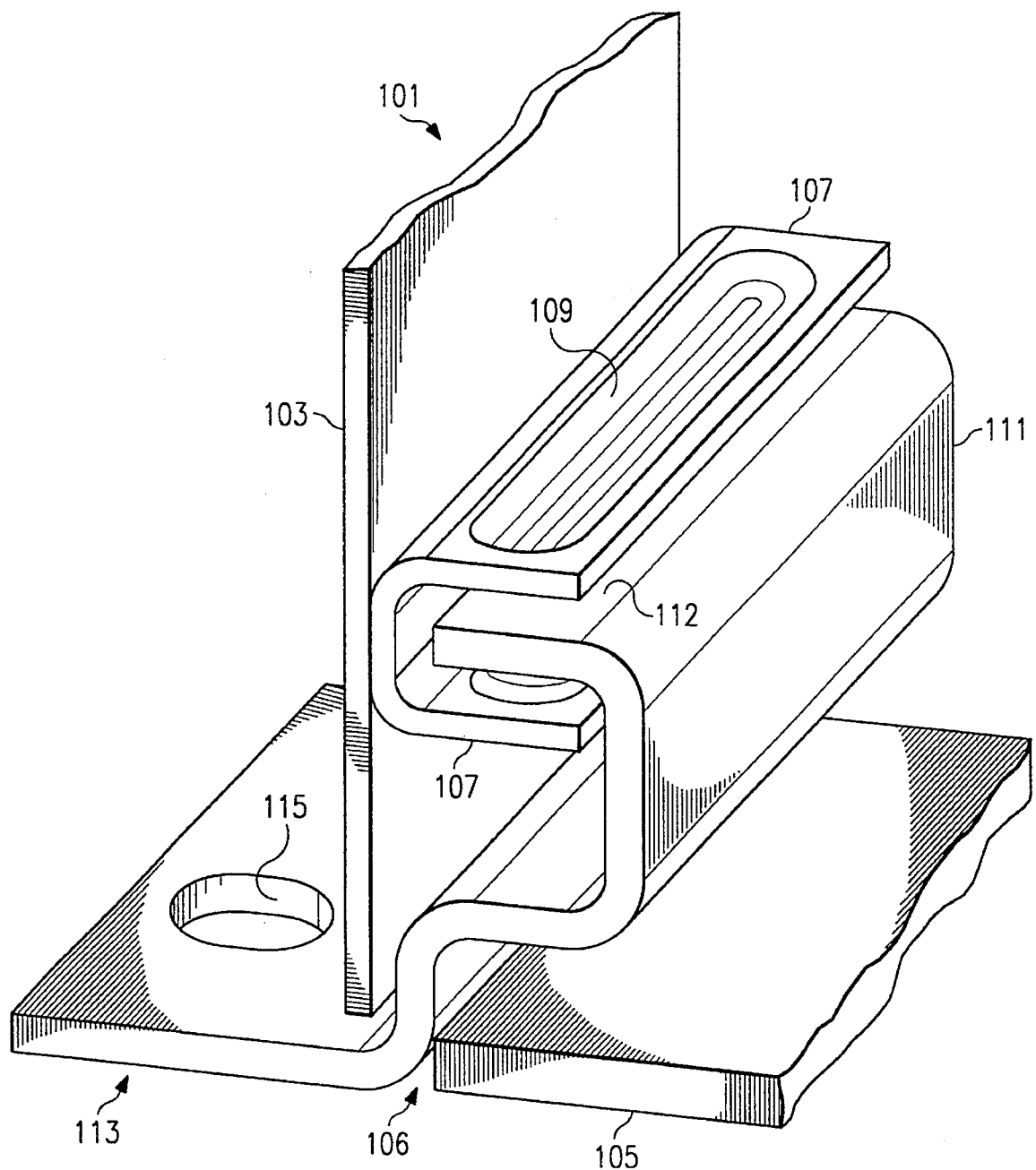
FIG. 1 is a top right perspective view of one embodiment of the mounting system of the present invention.

Referring now to the drawings in detail, in which like numerals refer to like parts, FIG. 1 in detail, there is shown a corner portion of a container housing, CPU box, server box, or other electronic component box 101 of typical rectangular design in which, in the present example, electronic components and boards are assembled as part of a larger system. Such a system may contain, for example, a so-called "CPU" box which would be part of a personal computer system, or a server box which would be part of a network system of PCs. The container or housing 101 is shown with the top and the bottom of the CPU unit removed to more clearly illustrate the detail of the present invention. The container 101 is shown with first and second corner side walls 103 and 105 which define a front corner of the CPU box. It is understood that the side walls 103 and 105 are secured relative to each other by the other three corners of the CPU box and also by attachment to the top or bottom covers to the CPU box or container 101.

Side wall 103 has mounted thereon a holding bracket 107 which further includes a retaining boss 109 formed as a part of the holding bracket 107. As can be seen in FIG. 1, the corner walls 103 and 105 are not joined together but define an opening or access passage 106. A mounting bracket 111 is shown with a locking section 112 positioned within the holding bracket 107 and held in place by the retaining boss 109. The mounting bracket 111 also includes a second section 113 which is shown extending from the corner section of the CPU or other electronic component box 101. In the FIG. 1 exemplary embodiment, an alignment, mounting or attaching hole 115 is shown within the second section 113 of the mounting bracket 111.

In general, the arrangement shown in FIG. 1 demonstrates a deployed position of the mounting bracket 111 in which the second section 113 of the bracket 111 is extended to be placed over a corresponding vertically disposed attaching or alignment lip of a mounting rack. Such racks may include two such alignment edges which are on each side of a mounting rack. An electronic box will generally fit between such edges and in some cases the boxes will have corresponding extensions such as the second section 113 of the bracket 111, which are designed to overlap the rack edge for alignment of the electronic box within the rack mount. Such an overlapping arrangement provides an aesthetic appearance and also secures the electronic box in place.

The box may be secured to a greater extent by using the aligning or attaching hole 115 in conjunction with corresponding attaching holes in the extended edge of a mounting rack. As shown in FIG. 1, the side wall 105 would face outwardly from the rack in which the electronic box 101 is mounted. In applications where it is desirable to have quick access to the CPU server box 101 on frequent occasions, either for servicing or modification, the second section 113 of the bracket 111 is not secured to the rack, (for example by using screws through the hole 115), but merely overlaps and lies in contact with the rack edge. In that situation, the server box 101 is attached to a sliding assembly, which is well known in the art, and is selectively pulled outwardly from the rack to yield access to the electronic on the inside of the CPU or server box 101.

The mounting system shown in FIG. 1, is arranged to allow the mounting bracket 111 to be easily removed from the server box 101 when it is necessary to relocate or remove the server box 101 from its rack mount. The second section 113 of the bracket 111 can be rotated clockwise to disengage the locking section 112 of the bracket 111 from the holding bracket 107 within the server box 101. The bracket 111 may then be slidably removed from the CPU box and carried or stored separately. The removal of the bracket 111 facilitates moving the server box 101 since there will be no extended portions of the box. Once the unit is placed at a new location or when it is to be remounted, the server box 101 may be placed in its rack position and the removable or detachable mounting bracket 111 may again be locked into the CPU box to provide an alignment or attaching lip or extension for alignment with a corresponding extension of the mounting rack assembly. The holding or latching function performed in the present example by the relationship between the retaining boss 109 and the locking section 112 of the bracket 111 may be implemented through many other arrangements and hardware locking or latching sets, and the present illustration is not intended to limit the scope of the present invention in any way. Similarly, the mounting hole 115 may be omitted from the mounting bracket 111 without departing from the scope or spirit of the present invention. Without the hole implementation, the second section 113 of the bracket 111 would serve as an overlapping member to overlap and align with a corresponding edge of a rack assembly and fill or cover-up the full width of the rack assembly as hereinbefore explained.

Figure 2:
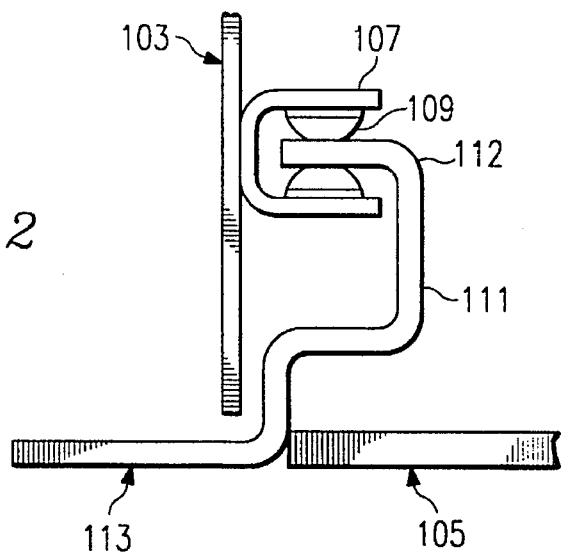
FIG. 2 is a top view of the mounting bracket of the present invention shown in engagement with a portion of the container with which it is used.

FIG. 2 shows the arrangement of FIG. 1 from a top view which better illustrates the arrangement of the retaining boss 109 to engage with the locking section 112 of the bracket 111.

Figure 3:
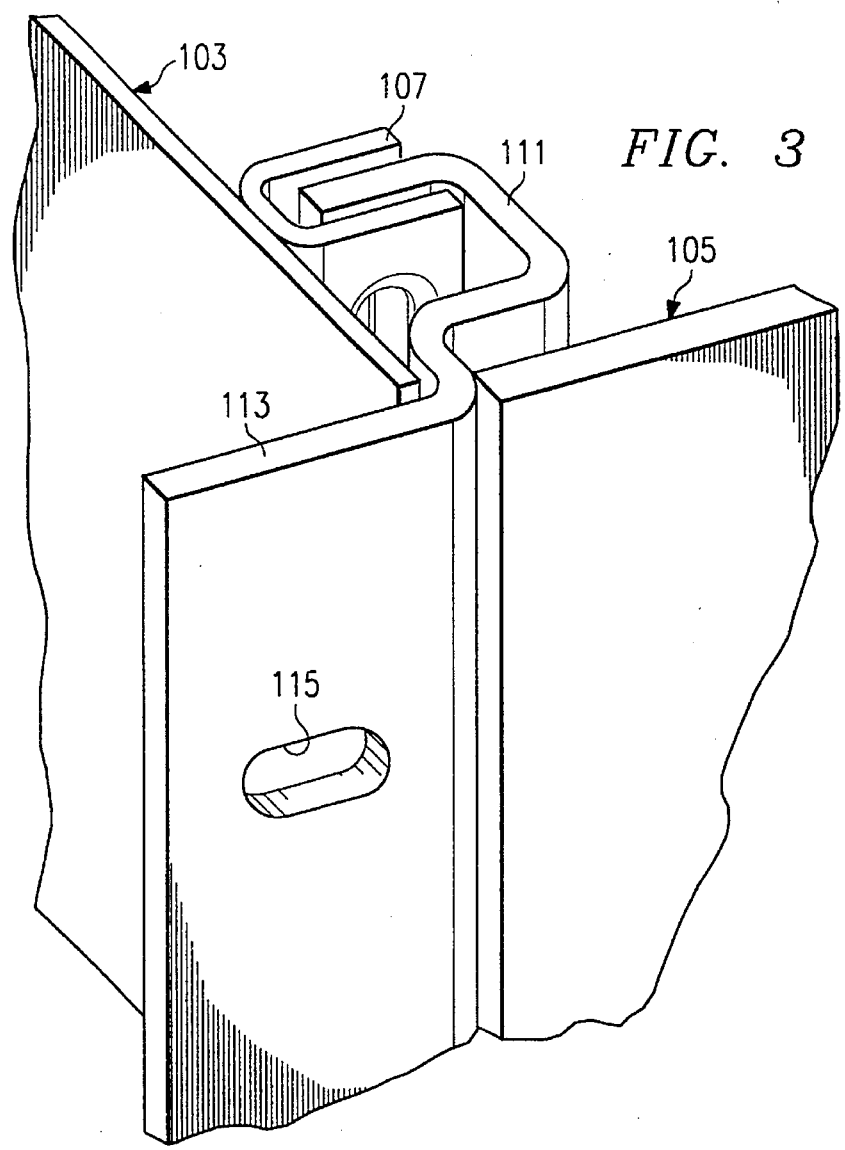
FIG. 3 is a top left view of the system shown in FIG. 1.

FIG. 3 is another perspective view of the arrangement shown in FIG. 1 and shows the same components from a different angle.

Figure 4:
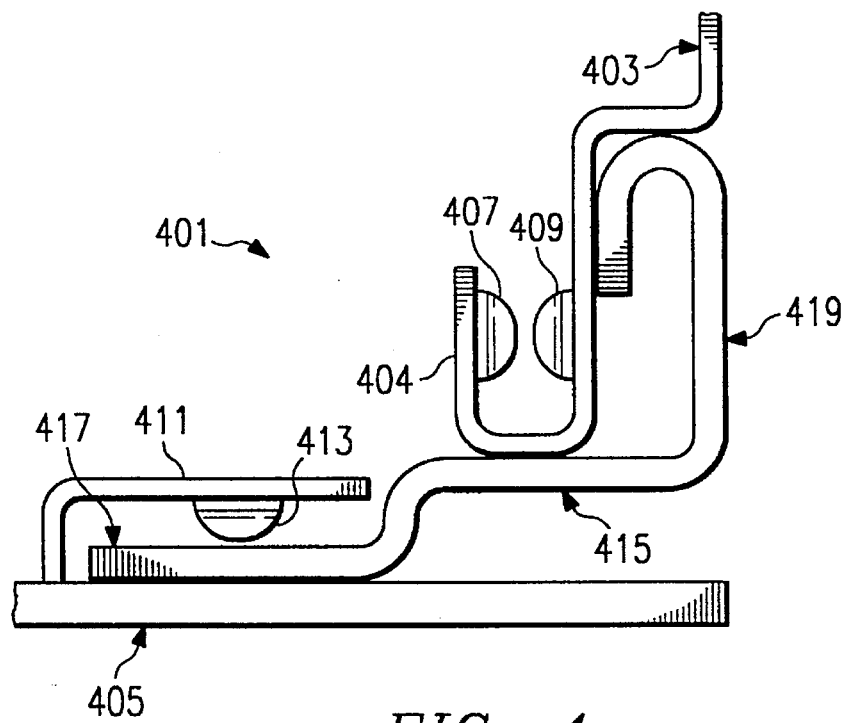
FIG. 4 is a top view of a second bracket embodiment shown in a detachable storage position within its associated container compartment.

FIG. 4 shows an exemplary embodiment of another mounting apparatus and system for the rack mounting of CPU or server electronic boxes. The view in FIG. 4 shows the right side corner of a CPU, container, or server electronic box 401. The present invention would be most frequently implemented with the bracket systems installed in the front left hand corner as shown in FIG. 1 and also the front right hand corner as shown in FIG. 4, although in any installation either one or the other of the mounting bracket systems shown in FIG. 1 and FIG. 4 would be implemented. The server box 401 includes a side wall 403 and a front wall 405. The side wall 403 is extended within the server box 401 to define a locking or holding bracket 404. The holding bracket 404 includes locking or latching retaining bosses 407 and 409. The front wall 405 also includes a storing bracket 411 with a locking boss 413.

A mounting bracket 415 is shown in a stored or shipping position in FIG. 4 where there are no extended edges from the server box 401. In that position, the bracket 415 is conveniently stored securely within the server box 401. The bracket 415 in the stored position is readily disengaged from its stored position as shown, and may then be installed in its deployed rack mounted position in a manner similar to that shown in connection with FIG. 1.

Figure 5:
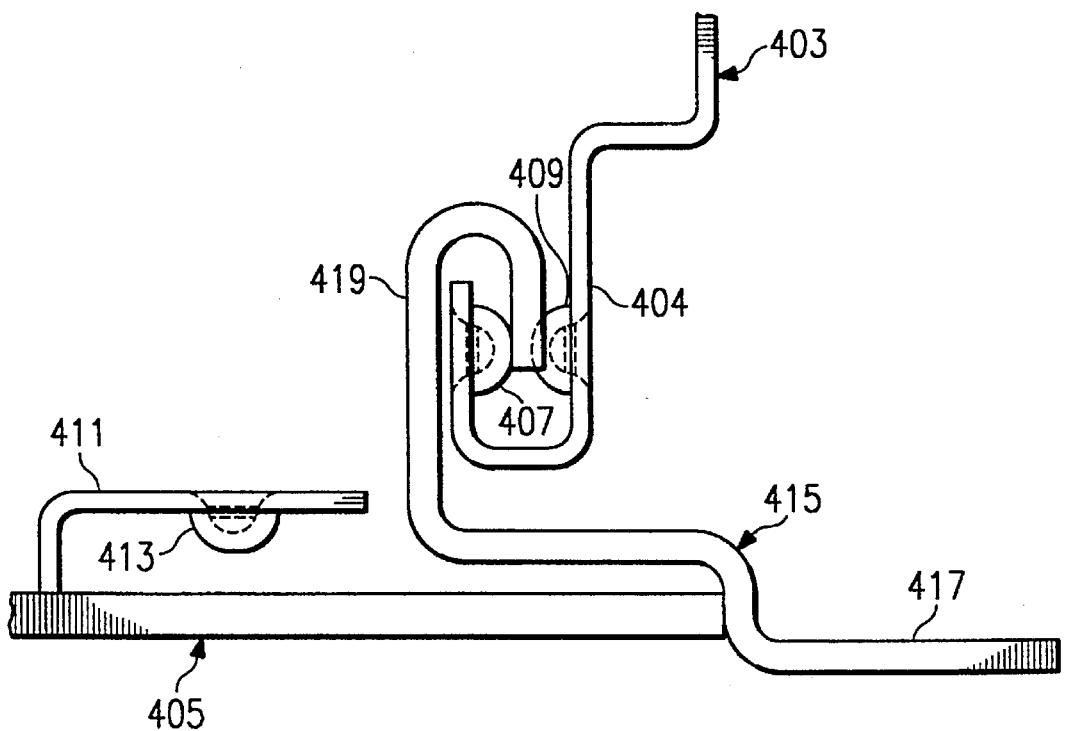
FIG. 5 is a top view of the bracket and mounting system shown in FIG. 4 but shown in a deployed mounted position.

The mounting bracket 415 includes an extended section 417 and a locking section 419. When the server 401 is to be installed in a rack mount, the bracket 415 is pulled out of the storage position within the storing bracket 411 and re-installed in a deployed or mounted position as shown in FIG. 5. In the deployed position, the locking section 419 of the bracket 415 is slidably engaged with and locked into the holding bracket 404 between the retaining bosses 407 and 409. The extended section 417 of the bracket 415 extends outwardly from the server box to overlap and align with a matching extension or lip on a mounting rack as was hereinbefore explained in connection with FIG. 1.

Figure 6:
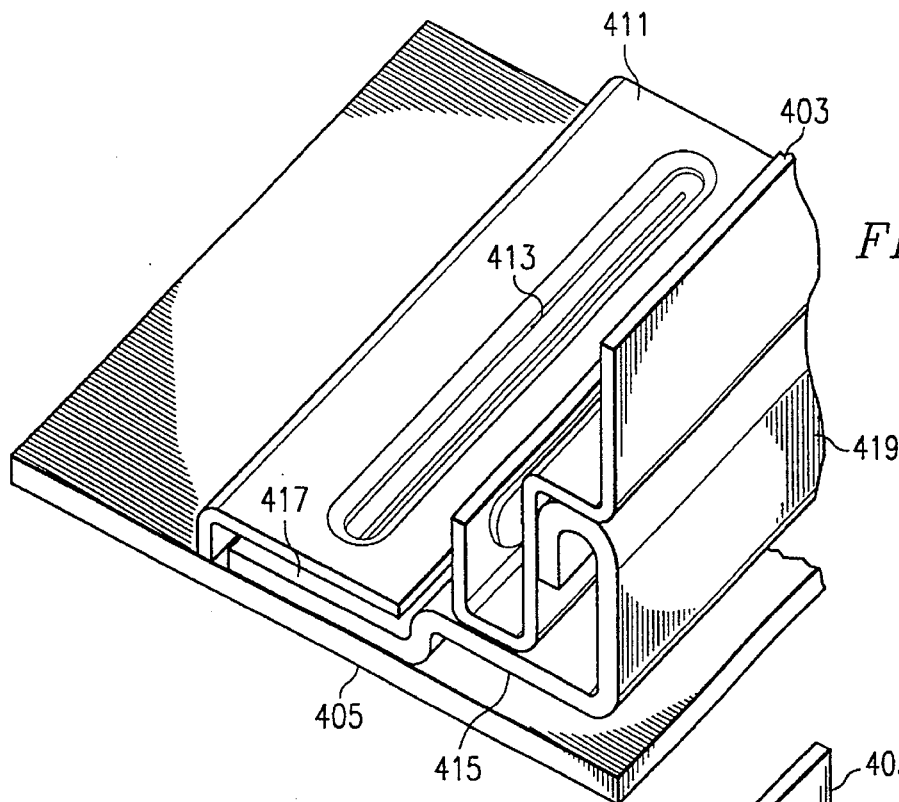
FIG. 6 is a perspective view of the bracket apparatus and system of FIG. 4 shown in the non-deployed, storage position.
Figure 7:
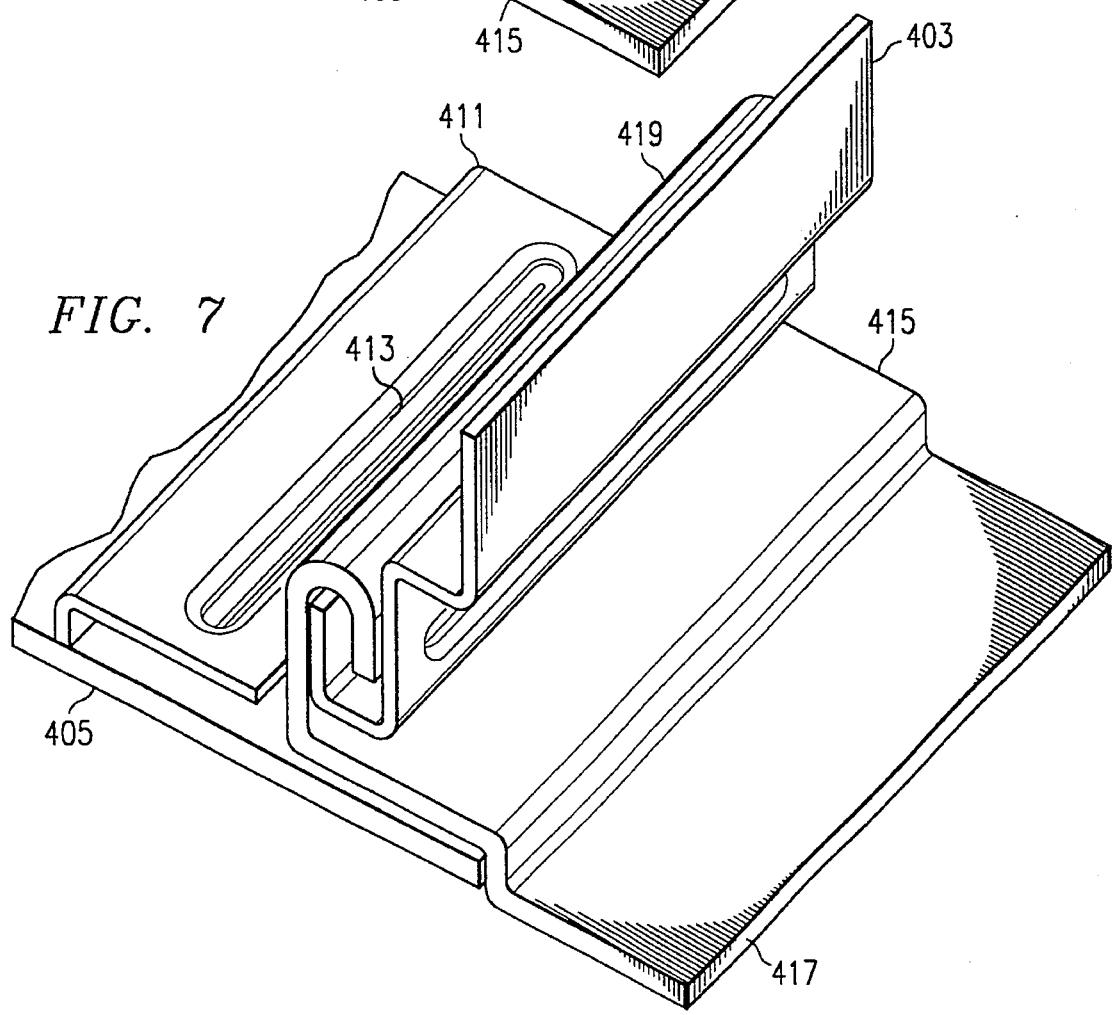
FIG. 7 is another perspective view of the mounting apparatus and system of FIG. 5 in a mounting position.

FIGS. 6 and 7 show perspective views of the arrangements shown in FIGS. 4 and 5, respectively and like numerals identify like parts.

Thus, there has been provided, in accordance with the present invention, an improved mounting system and bracket apparatus which can be stored within an electronic assembly with which it is used, and selectively detachable to be reinstalled as a mounting and alignment accessory to aid in the mounting of the electronic apparatus within a rack mount system.

The apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention as defined by the following claims.

We claim:

1. An integrated mounting system for mounting a container to a storage rack, said system comprising:

at least one mounting bracket having an extended section, wherein said at least one mounting bracket may be selectively positioned relative to said container in either a stored position in which said extended section is contained within said container, or in a mounted position in which said extended section extends outwardly from said container for mounting said container to said storage rack;

at least one storing bracket secured to said container for holding said at least one mounting bracket in said stored position; and at least one holding bracket secured to said container for holding said at least one mounting bracket in said mounted position.

2. The system as set forth in claim 1 wherein said at least one storing bracket is positioned within said container so that said extended section is precluded from extending from said container when said at least one mounting bracket is connected to said at least one storing bracket.

3. The system as set forth in claim 1 wherein said container is defined by a structure and said at least one storing bracket and said at least one holding bracket form an integral part of said structure of said container.

4. The system as set forth in claim 1 wherein said container includes a plurality of side walls, and said at least one storing bracket and said at least one holding bracket are connected to at least one of said plurality of side walls.

5. The system as set forth in claim 4 wherein said at least one storing bracket and said at least one holding bracket are connected to separate ones of said plurality of side walls.

6. The system as set forth in claim 5 wherein said at least one storing bracket and said at least one holding bracket are connected to adjacent ones of said side walls, said adjacent ones of said side walls defining an opening therebetween, said at least one holding bracket being positioned within said container so that when said at least one mounting bracket is held thereby, said extended section extends from the interior of said container to the exterior of said container through said defined opening.

7. The system as set forth in claim 4 wherein said at least one storing bracket and said at least one holding bracket are mounted on a surface of at least one of said side walls, which surface is interior to said container.

8. The system as set forth in claim 2 wherein said container includes a section recessed within said container for receiving said at least one mounting bracket when said at least one mounting bracket is connected to said at least one storing bracket.

9. The system as set forth in claim 7 wherein said at least one storing bracket and said at least one holding bracket are mounted in adjacent corners formed by said side walls.

10. A mounting system for mounting to a storage rack a container having at least one wall, said system comprising:

at least one holding bracket connectable to said wall; and at least one mounting bracket having a first section for extending into said container for engaging said at least one holding bracket, and a second section for extending outwardly from said container for engaging said storage rack to thereby mount said container to said storage rack.

11. The system of claim 12 wherein said at least one holding bracket includes a retaining boss for retaining said at least one mounting bracket when said at least one mounting bracket engages said at least one holding bracket.

12. The system of claim 10 wherein said second section defines at least one attaching hole, and said system further comprises a screw for extension through said at least one hole into said storage rack for securing said container thereto.

\* \* \* \* \*

UNITED STATES PATENT AND TRADEMARK OFFICE
CERTIFICATE OF CORRECTION

PATENT NO. : 5,579,924
DATED : December 3, 1996
INVENTOR(S) : Steve Sands et al.

It is certified that error appears in the above-indentified patent and that said Letters Patent is hereby corrected as shown below:

Col. 2, line 66, "had" should be --read--.

Col. 2, line 67, "dryings" should be --drawings--.

Signed and Sealed this

Fourth Day of March, 1997

*Attest:*

BRUCE LEHMAN

*Attesting Officer*    *Commissioner of Patents and Trademarks*